United States Patent [19]

McLaughlin

[11] Patent Number: 4,636,665

[45] Date of Patent: Jan. 13, 1987

[54] BIMOS MEMORY SENSE AMPLIFIER

[75] Inventor: Kevin L. McLaughlin, Chandler, Ariz.

[73] Assignee: Motorola, Inc., Schaumburg, Ill.

[21] Appl. No.: 803,279

[22] Filed: Dec. 2, 1985

[51] Int. Cl.$^4$ .......................... H03K 5/24; G11C 7/06
[52] U.S. Cl. ................................. 307/530; 307/355; 307/491; 307/495
[58] Field of Search ............... 307/530, 355, 362, 491, 307/495, 499, 570; 365/207, 208, 190; 330/253, 255, 264

[56] References Cited

U.S. PATENT DOCUMENTS

| | | | |
|---|---|---|---|
| 3,444,472 | 5/1969 | Johnson | 365/207 X |
| 4,267,517 | 5/1981 | Iida et al. | 330/264 X |
| 4,271,394 | 6/1981 | Leidich | 330/253 X |
| 4,375,039 | 2/1983 | Yamauchi | 307/530 |
| 4,553,053 | 11/1985 | Ong et al. | 365/190 X |

OTHER PUBLICATIONS

Schade, "A New Generation of MOS/Bipolar Operational Amplifiers"; *RCA Review;* vol. 37, No. 3, pp. 404–424; 9/1976.

Miyamoto et al., "A High-Speed 64K CMOS RAM with Bipolar Sense Amplifiers"; *IEEE-JSSC;* vol. SC-19, No. 5, pp. 557–563; 10/1984.

Lee et al., "BI-CMOS Technology for High-Performance VLSI Circuits"; *VLSI Design;* 8/1984, pp. 98–100.

Bursky, *Electronic Design,* pp. 106–118; 10/4/1984.

*Primary Examiner*—Larry N. Anagnos
*Attorney, Agent, or Firm*—William E. Koch

[57] ABSTRACT

A BIMOS memory sense amplifier is provided having the low power dissipation and high noise immunity of CMOS devices while maintaining the high drive capability and switching speed associated with bipolar devices. A pair of differentially connected NPN transistors are coupled for receiving a first and a second bit current from the bit lines of a memory circuit. A MOS transistor circuit is coupled to the NPN transistors and is responsive to a differential output therefrom, for buffering two NPN push-pull output transistors.

3 Claims, 1 Drawing Figure

U.S. Patent  Jan. 13, 1987  4,636,665
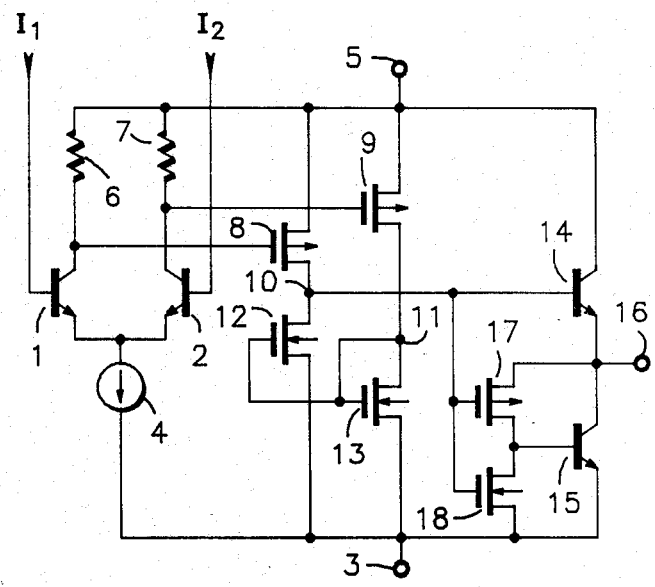

BIMOS MEMORY SENSE AMPLIFIER

FIELD OF THE INVENTION

This invention relates in general to semiconductor integrated circuit differential circuits and, more particularly, to a BIMOS memory sense amplifier having the low power dissipation and high noise immunity of CMOS devices while maintaining the high drive capability and switching speed associated with bipolar devices.

BACKGROUND OF THE INVENTION

Memory cells are circuits wherein information may be stored in a low current stand-by mode and may be written or read in a higher current mode. A predetermined number of cells are located in a row between each of a plurality of upper and lower word lines and another predetermined number of cells are located in a column between a plurality of bit lines. In other words, each cell is uniquely coupled between a combination of word lines and bit lines.

A row of cells is selected when increased voltage is supplied to the upper word line. A particular cell in that row is read by a sense amplifier coupled to the bit lines. A first read current through one bit line flows directly to the sense amplifier. A second read current through the other bit line flows through one side of the memory cell to the upper word line. When a cell is written, the first read current is directed through the cell and the second read current is directed to the sense amplifier.

The sense amplifier typically comprises a pair of differentially connected transistors responsive to the voltage on the bit lines and having a current carrying electrode of each transistor coupled in some manner to an output. Conventional memory sense amplifiers were entirely bipolar or MOS (metal-oxide-semiconductor) circuits that provided the relative merits of each. Bipolar sense amplifiers provide fast gate speeds, narrow transition widths and reduced delay per unit load. CMOS sense amplifiers provide high noise immunity, high input impedance, low power requirements, but a wider transition width. However, a large CMOS structure is required when driving large capacitive loads and in most cases, several stages of scaled CMOS inverters are necessary in order to minimize the total delay. For BIMOS memories having a large number of devices, it is desirable that each MOS device be of small size. As the size of a MOS device is reduced, the transconductance of the device and consequently the ability to drive a heavy capacitive load is also reduced. Bipoler devices continue to be used for driving these capacitive loads due to their high current gain. In quiesent periods, the bipolar push-pull transistors do not dissipate power. During transient periods, the bipolar current gain allows faster charging and discharging of capactive loads. This results in a significant decrease in metal and fanout delays.

Attempts to combine bipolar and MOS technology to achieve all of these results have been numerous in recent years. Furthermore, smaller CMOS devices may be used in the BIMOS circuit than those required in an all-CMOS device circuit.

One previously known memory sense amplifier combining bipolar and MOS technologies was disclosed in "A High-Speed 64K CMOS RAM with Bipolar Sense Amplifiers", IEEE JOURNAL OR SOLID-STATE CIRCUITS, Vol. SC-19, No. 5, October 1984, page 559, FIG. 5(c). A first pair of differentially connected bipolar transistors have their bases coupled for receiving current from the bit lines of a memory circuit. The emitters of the first pair of differentially connected bipolar transistors have their emitters connected to the bases of a second pair of differentially connected bipolar transistors. The collectors of the second pair of differentially connected bipolar transistors are connected to the gates of a pair of differentially connected MOS transistors having current supplied thereto by a MOS current mirror. The drain of one of the differentially connected MOS transistors is connected to an output amplifier.

However, this circuit suffers from long delays and the need for two CMOS stages to obtain adequate output drive.

Thus, what is needed is a BIMOS memory sense amplifier having the low power dissipation and high noise immunity of CMOS devices while maintaining the high drive capability and switching speed associated with bipolar devices.

SUMMARY OF THE INVENTION

Accordingly, it is an object of the present invention to provide an improved BIMOS memory sense amplifier.

Another object of the present invention to provide an inproved BIMOS memory sense amplifier having low power requirements.

Still another object of the present invention is to provide an improved BIMOS memory sense amplifier having high drive capability.

Yet another object of the present invention to provide an improved BIMOS memory sense amplifier having improved output signal switching characteristics.

A further object of the present invention to provide an improved BIMOS memory sense amplifier having high noise immunity.

In carrying out the above and other objects of the invention in one form, there is provided a BIMOS memory sense amplifier having a pair of diffrentially connected NPN transistors coupled for receiving a first and a second bit current from the bit lines of a memory circuit. A MOS transistor circuit is coupled to the NPN transistors and is responsive to a differential output therefrom, for buffering two NPN push-pull output transistors.

The above and other objects, features, and advantages of the present invention will be better understood from the following detailed description taken in conjunction with the accompanying drawings.

BRIEF DESCRIPTION OF THE DRAWING

The single FIGURE is a schematic of the preferred embodiment of the present invention.

DETAILED DESCRIPTION OF THE INVENTION

Referring to the single FIGURE, a circuit in accordance with the present invention is shown which is suitable to be fabricated in monolithic integrated circuit form. Differentially connected NPN transistors 1 and 2 have their bases coupled for receiving current $I_1$ and $I_2$, respectively, their emitters coupled to supply voltage terminal 3 by current source 4, and their collectors coupled to supply voltage terminal 5 by resistors 6 and 7, respectively. Currents $I_1$ and $I_2$ may be supplied by any type of circuit; however, the circuit described herein is suited well as a memory sense amplifier of a memory circuit, wherein $I_1$ and $I_2$ would be currents from the bit lines of a column of memory cells.

The collectors of differentially connected NPN transistors 1 and 2 are connected to the gates of P-channel MOS transistors 8 and 9, respectively. Transistor 8 has its source and drain connected, respectively, to supply voltage terminal 5 and node 10. Transistor 9 has its source and drain connected, respectively, to supply voltage terminal 5 and node 11. N-channel MOS transistor 12 has its drain connected to node 10, its source connected to supply voltage terminal 3, and its gate connected to node 11. N-channel MOS transistor has its drain connected to node 11, its source connected to supply voltage terminal 3, and its gate connected to node 11. Transistors 8, 9, 12 and 13 serve as a current mirror for supplying substantially equal current to nodes 10 and 11.

NPN transistors 14 and 15 comprise a pair of push-pull output transistors. Transistor 14 has its collector and emitter connected, respectively, to supply voltage terminal 5 and output terminal 16. Transistor 15 has its collector and emitter connected, respectively, to output terminal 16 and supply voltage terminal 3.

P-channel MOS transistor 17 has its source and drain connected, respectively, to output terminal 16 and the base of transistor 15. N-channel MOS transistor 18 has its drain and source connected, respectively, to the base of transistor 15 and supply voltage terminal 3. The gates of transistors 17 and 18 and the base of transistor 14 are connected to node 10.

A digital high signal applied as current $I_1$ and a digital low signal applied as current $I_2$ cause a digital low and high signals to be applied to the gates of transistors 8 and 9, respectively. Transistor 8 will be rendered conductive, causing transistors 14 and 18 to be rendered conductive. Output terminal 16 will assume the voltage level of supply voltage terminal 5 minus the base-emitter voltage of transistor 14. Transistor 18 increases the speed at which transistor 15 turns off by draining current from its base.

A digital low signal applied as current $I_1$ and a digital high signal applied as current $I_2$ cause a digital high and low signals to be applied to the gates of transistors 8 and 9, respectively. Transistor 8 will be rendered non-conductive, causing transistors 17 and 15 to be rendered conductive. Output terminal 16 will assume the voltage level of supply voltage terminal 3 plus the base-emitter voltage of transistor 15.

Although the circuit described herein illustrate NPN transistors, P-channel and N-channel MOS transistors, various combinations of PNP transistors and MOS transistors may be used in a manner known to those skilled in the art in order to accomplish the teachings of this invention. Furthermore, although only one logic gate comprising transistors, 8, 12, 14, 15, 17 and 18 has been described, various other forms of a BIMOS logic gate could substituted therefor while accomplishing the advantages described herein.

By now it should be appreciated that there has been provided a BIMOS memory sense amplifier having a low power dissipation and high noise immunity of CMOS devices while maintaining the high drive capability and switching speed associated with bipolar devices.

I claim:

1. A circuit comprising:
a first supply voltage terminal;
a second supply voltage terminal;
first and second input terminals;
an output terminal;
a first bipolar transistor coupled between said first supply voltage terminal and said output terminal;
a second bipolar transistor coupled between said output terminal and said second supply voltage terminal;
a pair of differentially connected bipolar transistors coupled between said first and second supply voltage terminals and having their bases coupled to said first and second input terminals for receiving a first and a second input signal, respectively, and having their collectors coupled for providing a first and a second output, respectively;
first means coupled between said first and second supply voltage terminals and coupled to said pair of differentially connected transistors and said first bipolar transistor for providing a voltage for biasing said first bipolar transistor, said first means providing a high impedance to said pair of differentially connected transistors, said first means comprising:
a first P-channel MOS transistor having a source coupled to said first supply voltage terminal, a gate coupled to a collector of one of said pair of differentially connected transistors, and a drain coupled to the base of said first bipolar transistor;
a second P-channel MOS transistor having a source coupled to said first supply voltage terminal and a gate coupled to a collector of the other of said pair of differentially connected transistors;
a first N-channel MOS transistor having a drain coupled to said base of said first bipolar transistor and a source coupled to said second supply voltage terminal; and
a second N-channel MOS transistor having a drain and a gate coupled to a gate of said first N-channel transistor and to a drain of said second P-channel MOS transistor and a source coupled to said second supply voltage terminal; and
second means coupled between said output terminal and said second supply voltage terminal and coupled to said first means and said second bipolar transistor for biasing said second bipolar transistor.

2. The circuit according to claim 1 wherein said second means comprises:
a third P-channel MOS transistor having a source coupled to said output terminal, a drain coupled to a base of said second bipolar transistor, and a gate coupled to said base of said first bipolar transistor; and
a third N-channel MOS transistor having a drain coupled to the base of said second bipolar transistor, a source coupled to said second supply voltage terminal, and a gate coupled to said base of said first bipolar transistor.

3. The circuit according to claim 1 wherein said second means comprises:
a third P-channel MOS transistor having a source coupled to said output terminal, a drain coupled to a base of said second bipolar transistor, and a gate coupled to said base of said first bipolar transistor; and
third means coupled between said base of said second bipolar transistor and said second supply voltage terminal for sinking current from said base of said second bipolar transistor.

* * * * *